(12) United States Patent
Furukawa et al.

(10) Patent No.: US 8,610,211 B2
(45) Date of Patent: Dec. 17, 2013

(54) SEMICONDUCTOR-ON-INSULATOR (SOI) STRUCTURE WITH SELECTIVELY PLACED SUB-INSULATOR LAYER VOID(S) AND METHOD OF FORMING THE SOI STRUCTURE

(75) Inventors: Toshiharu Furukawa, Essex Junction, VT (US); Robert R. Robison, Colchester, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 298 days.

(21) Appl. No.: 12/842,146

(22) Filed: Jul. 23, 2010

(65) Prior Publication Data

US 2012/0018806 A1    Jan. 26, 2012

(51) Int. Cl.
*H01L 27/12*        (2006.01)
(52) U.S. Cl.
USPC .................................. 257/347; 257/E27.111
(58) Field of Classification Search
USPC .......... 257/347–349, E21.703, E27.111, 351, 257/354, 374–376, E21.415
See application file for complete search history.

(56) References Cited

U.S. PATENT DOCUMENTS

| | | | |
|---|---|---|---|
| 5,466,963 A * | 11/1995 | Beasom ........................ | 257/516 |
| 5,915,192 A * | 6/1999 | Liaw et al. .................... | 438/435 |
| 6,127,251 A | 10/2000 | Gardener et al. | |
| 6,133,610 A * | 10/2000 | Bolam et al. .................. | 257/349 |
| 6,232,202 B1 * | 5/2001 | Hong ............................ | 438/424 |
| 6,294,817 B1 | 9/2001 | Srinivasan et al. | |
| 6,830,987 B1 | 12/2004 | Pelella et al. | |
| 6,906,384 B2 | 6/2005 | Yamada et al. | |
| 6,969,628 B2 | 11/2005 | Bertz et al. | |
| 7,205,173 B2 | 4/2007 | Brunson et al. | |

(Continued)

FOREIGN PATENT DOCUMENTS

| | | |
|---|---|---|
| JP | 2003-298047 | 10/2003 |
| JP | 2006-261662 | 9/2006 |

OTHER PUBLICATIONS

Kilchytska et al., "Electrical Characterization of True Silicon-on-Nothing MOSFETs Fabricated by SI Layer Transfer Over a Pre-Etched Cavity," Solid State Electronics, vol. 51, Issue 9, Sep. 2007, pp. 1238-1244.

(Continued)

*Primary Examiner* — Vongsavanh Sengdara
(74) *Attorney, Agent, or Firm* — Gibb & Riley, LLC; Richard M. Kotulak, Esq.

(57) ABSTRACT

Disclosed is a semiconductor-on-insulator (SOI) structure having sub-insulator layer void(s) selectively placed in a substrate so that capacitance coupling between a first section of a semiconductor layer and the substrate will be less than capacitance coupling between a second section of the semiconductor layer and the substrate. The first section may contain a first device on an insulator layer and the second section may contain a second device on the insulator layer. Alternatively, the first and second sections may comprise different regions of the same device on an insulator layer. For example, in an SOI field effect transistor (FET), sub-insulator layer voids can be selectively placed in the substrate below the source, drain and/or body contact diffusion regions, but not below the channel region so that capacitance coupling between the these various diffusion regions and the substrate will be less than capacitance coupling between the channel region and the substrate. Also, disclosed is an associated method of forming such an SOI structure.

20 Claims, 14 Drawing Sheets

(56) References Cited

U.S. PATENT DOCUMENTS

| | | |
|---|---|---|
| 7,235,439 B2 | 6/2007 | Udrea et al. |
| 7,315,052 B2 | 1/2008 | Alter |
| 7,339,253 B2 * | 3/2008 | Tsai et al. ............ 257/522 |
| RE40,339 E * | 5/2008 | Bolam et al. ............ 257/349 |
| 7,804,151 B2 * | 9/2010 | Brown et al. ............ 257/510 |
| 2002/0076899 A1 | 6/2002 | Skotnicki et al. |
| 2005/0139952 A1 * | 6/2005 | Koh ............ 257/510 |
| 2005/0242368 A1 | 11/2005 | Udrea et al. |
| 2005/0242369 A1 | 11/2005 | Udrea et al. |
| 2006/0208342 A1 | 9/2006 | Choi et al. |
| 2006/0220108 A1 * | 10/2006 | Hashimoto ............ 257/330 |
| 2006/0263991 A1 * | 11/2006 | Lee et al. ............ 438/296 |
| 2008/0286952 A1 * | 11/2008 | Miyairi et al. ............ 438/517 |
| 2009/0170279 A1 | 7/2009 | Kim et al. |
| 2010/0032796 A1 | 2/2010 | Brown et al. |
| 2010/0035403 A1 | 2/2010 | Brown et al. |
| 2010/0258869 A1 * | 10/2010 | Morita et al. ............ 257/347 |
| 2012/0149171 A1 * | 6/2012 | Liaw et al. ............ 438/424 |

OTHER PUBLICATIONS

Wu et al., "A Novel Source/Drain on Void (SDOV) MOSTEF Implemented by Local Co-Implantation of Hydrogen and Helium," Microelectronic Engineering, vol. 85, Issue 7, Jul. 2008, pp. 1490-1494.

Botula et al., "Silicon-on-Insulator (SOI) Structure Configured for Reduced Harmonics and Method of Forming the Structure," U.S. Appl. No. 12/627,343, filed Nov. 30, 2009.

Botula et al., "Silicon-on-Insulator (SOI) Structure Configured for Reduced Harmonics and Method of Forming the Structure," U.S. Appl. No. 12/634,893, filed Dec. 10, 2009.

* cited by examiner

SEMICONDUCTOR-ON-INSULATOR (SOI) STRUCTURE WITH SELECTIVELY PLACED SUB-INSULATOR LAYER VOID(S) AND METHOD OF FORMING THE SOI STRUCTURE

BACKGROUND

1. Field of the Invention

The embodiments of the invention generally relate to semiconductor-on-insulator (SOI) structures and, more specifically, to an SOI structure, such as an SOI field effect transistor (FET), having selectively placed sub-insulator layer void(s) and a method of forming the SOI structure.

2. Description of the Related Art

By providing a buried insulator layer between a semiconductor device layer and the semiconductor substrate, semiconductor-on-insulator (SOI) structures minimize parasitic capacitance between devices and the substrate as compared to bulk semiconductor structures. While it may be desirable to minimize capacitance coupling between some devices and the substrate, it may also be desirable to allow strong capacitance coupling between other devices and the substrate. For example, traditional single-gated CMOS devices can benefit from reduced substrate coupling, while double-gated or back-gated CMOS devices can benefit from enhanced substrate coupling, thereby allowing for the substrate to be used as the back gate. Furthermore, while it may be desirable to minimize capacitance coupling between one or more regions of a particular device (e.g., the source diffusion region, the drain diffusion region and/or the body contact diffusion region of an SOI field effect transistor (FET)) and the substrate, it may also be desirable to allow for strong capacitance coupling between another region of the same device (e.g., the channel region of the same SOI FET) and the substrate. This is the case, for example, in low or mixed frequency applications, such as phase locked loops (PLLs), and in other applications where diffusion-to-substrate capacitance is not depleted. Therefore, there is a need in the art for an SOI structure and an associated method of forming the SOI structure that provides for selectively adjusted capacitance coupling between different regions of the semiconductor layer and the substrate.

SUMMARY

Disclosed herein are embodiments of a semiconductor-on-insulator (SOI) structure having sub-insulator layer void(s) selectively placed in a substrate so that capacitance coupling between a first section of a semiconductor layer and the substrate will be less than capacitance coupling between a second section of the semiconductor layer and the substrate. Specifically, the first section may contain a first device on an insulator layer and the second section may contain a second device on the insulator layer. A sub-insulator layer void selectively placed in the substrate below the first device and not below the second device ensures that capacitance coupling between the first device and the substrate will be less than capacitance coupling between the second device and the substrate. Alternatively, the first and second sections may comprise different regions of the same device on an insulator layer. A sub-insulator layer void selectively placed in the substrate below a first region of a device and not below a second region of the same device ensures that capacitance coupling between the first region and the substrate will be less than capacitance coupling between the second region and the substrate. For example, in an SOI field effect transistor (FET), sub-insulator layer voids can be selectively placed in the substrate below the source diffusion region, the drain diffusion region and/or the body contact diffusion region, but not below the channel region so that capacitance coupling between the these various diffusion regions and the substrate will be less than capacitance coupling between the channel region and the substrate. Also, disclosed herein are embodiments of an associated method of forming such an SOI structure.

More particularly, disclosed are embodiments of a semiconductor-on-insulator (SOI) structure. This SOI structure can comprise a semiconductor substrate, an insulator layer on the top surface of the semiconductor substrate, and a semiconductor layer on the insulator layer. The semiconductor layer can comprise a first section and a second section positioned laterally adjacent to the first section. Additionally, a void can be positioned within the semiconductor substrate at the top surface such that it is immediately adjacent to the insulator layer and also aligned below the first section. In such an SOI structure, the first section may contain a first device and the second section may contain a second device. Due to the sub-insulator layer void positioned below the first section, but not below the second section, capacitance coupling between the first device and the substrate will be less than capacitance coupling between the second device and the substrate. Alternatively, the first and second sections may comprise first and second regions, respectively, of the same device. Due to a sub-insulator layer void positioned below the first section, but not the second section capacitance coupling between the first region and the substrate will be less than capacitance coupling between the second region and the substrate.

For example, in one particular embodiment, the SOI structure can comprise an SOI field effect transistor (FET). This SOI FET can comprise a semiconductor substrate, an insulator layer on the top surface of the semiconductor substrate and a semiconductor layer on the insulator layer. The semiconductor layer can comprise source and drain diffusion regions and a channel region positioned laterally between the source and drain diffusion regions. Additionally, voids can be positioned in the semiconductor substrate at the top surface and immediately adjacent to the insulator layer. Furthermore, each one of the voids can be aligned below a corresponding one of the source and drain diffusion regions without extending laterally below the channel region. Since the voids are positioned below the source and drain diffusion regions, but not below the channel region, capacitance coupling between the source and drain diffusion regions and the substrate will be less than capacitance coupling between the channel region and the substrate.

Also disclosed herein are embodiments of a method of forming the above-described semiconductor-on-insulator (SOI) structure. The method can comprise forming a semiconductor-on-insulator (SOI) wafer. This SOI wafer can be formed such that it comprises a semiconductor substrate, an insulator layer on the top surface of the semiconductor substrate and a semiconductor layer, comprising a first section positioned laterally adjacent to a second section, on the insulator layer. A void can be formed in the semiconductor substrate and, specifically, at the top surface of the semiconductor substrate immediately adjacent to the insulator layer and aligned below the first section. By forming such a void below the first section but not the second section, capacitance coupling between the first section and the substrate will be less than capacitance coupling between the second section and the substrate.

The method can also comprise forming a first device in the first section of the semiconductor layer and a second device in the second section of the semiconductor layer. Thus, the sub-insulator layer void selectively placed below the first section, but not the second section, ensures that capacitance coupling between the first device and the substrate will be less than capacitance coupling between the second device and the substrate. Alternatively, the method can also comprise forming first and second regions of the same device within the first and second sections, respectively. Thus, the sub-insulator layer void selectively placed below the first section, but not the second section, ensures that capacitance coupling between the first region and the substrate will be less than capacitance coupling between the second region and the substrate.

For example, in one particular embodiment, the method of forming an SOI structure can comprise forming an SOI field effect transistor (FET). Specifically, in this embodiment, the method can comprise forming a semiconductor-on-insulator (SOI) wafer. This SOI wafer can be formed such that it comprises a semiconductor substrate, an insulator layer on the top surface of the semiconductor substrate and a semiconductor layer on the insulator layer. The method can further comprising forming, within the semiconductor layer, source and drain diffusion regions and a channel region positioned laterally between the source and drain diffusion regions. Additionally, voids can be formed in the semiconductor substrate at the top surface adjacent to the insulator layer. These voids can be formed such that each one of the voids is aligned below a corresponding one of the source and drain diffusion regions. By forming such voids below the source and drain diffusion regions and not below the channel region, capacitance coupling between the source and drain diffusion regions and the substrate will be less than capacitance coupling between the channel region and the substrate.

BRIEF DESCRIPTION OF THE DRAWINGS

The embodiments of the invention will be better understood from the following detailed description with reference to the drawings, which are not necessarily drawing to scale and in which.

DETAILED DESCRIPTION

Figure 1:
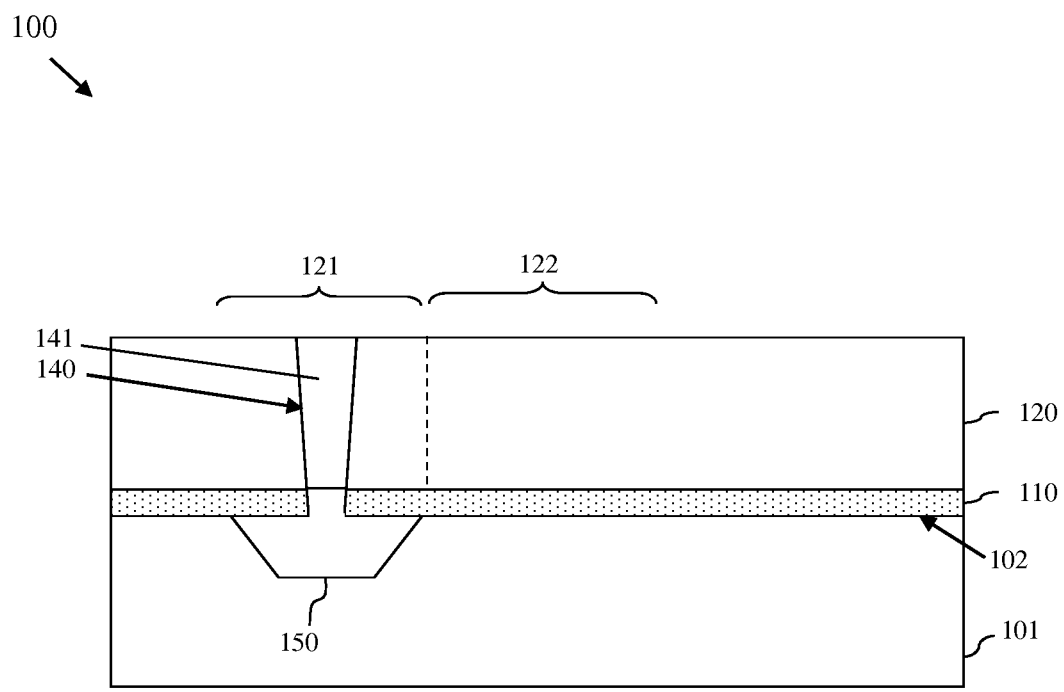
FIG. 1 is a cross-section diagram illustrating an embodiment of a semiconductor-on-insulator (SOI) structure.

The embodiments of the invention and the various features and advantageous details thereof are explained more fully with reference to the non-limiting embodiments that are illustrated in the accompanying drawings and detailed in the following description.

As mentioned above, by providing a buried insulator layer between a semiconductor device layer and the semiconductor substrate, semiconductor-on-insulator (SOI) structures minimize parasitic capacitance between devices and the substrate as compared to bulk semiconductor structures. While it may be desirable to minimize capacitance coupling between some devices and the substrate, it may also be desirable to allow strong capacitance coupling between other devices and the substrate. Furthermore, while it may be desirable to minimize capacitance coupling between one or more regions of a device (e.g., the source diffusion region, the drain diffusion region and/or the body contact diffusion region of an SOI field effect transistor (FET)) and the substrate, it may also be desirable to allow for strong capacitance coupling between another region of the same device (e.g., the channel region of the same SOI FET) and the substrate. Therefore, there is a need in the art for an SOI structure and an associated method of forming the SOI structure that provides for selectively adjusted capacitance coupling between different regions of the semiconductor layer and the substrate.

In view of the foregoing, disclosed herein are embodiments of a semiconductor-on-insulator (SOI) structure having sub-insulator layer void(s) selectively placed in a substrate so that capacitance coupling between a first section of a semiconductor layer and the substrate will be less than capacitance coupling between a second section of the semiconductor layer and the substrate. Specifically, the first section may contain a first device on an insulator layer and the second section may contain a second device on the insulator layer. A sub-insulator layer void selectively placed in the substrate below the first device and not below the second device ensures that capacitance coupling between the first device and the substrate will be less than capacitance coupling between the second device and the substrate. Alternatively, the first and second sections may comprise different regions of the same device on an insulator layer. A sub-insulator layer void selectively placed in the substrate below a first region of a device and not below a second region of the same device ensures that capacitance coupling between the first region and the substrate will be less than capacitance coupling between the second region and the substrate. For example, in an SOI field effect transistor (FET), sub-insulator layer voids can be selectively placed in the substrate below the source diffusion region, the drain diffusion region and/or the body contact diffusion region, but not below the channel region so that capacitance coupling between the these various diffusion regions and the substrate will be less than capacitance coupling between the channel region and the substrate. Also, disclosed herein are embodiments of an associated method of forming such an SOI structure.

More particularly, referring to FIG. 1, disclosed are embodiments of a semiconductor-on-insulator (SOI) structure 100. This SOI structure 100 can comprise a semiconductor substrate 101, an insulator layer 110 on the top surface 102 of the semiconductor substrate 101, and a semiconductor layer 120 on the insulator layer 110. The semiconductor substrate 101 can comprise a silicon substrate or any other suitable semiconductor substrate. The insulator layer 110 can comprise a buried oxide (BOX) layer (e.g., a silicon dioxide ($SiO_2$) layer) or any other suitable insulator layer. The semiconductor layer 120 can comprise a single crystalline semiconductor layer, such as a silicon layer, a silicon germanium layer, or any other semiconductor layer suitable SOI device formation. The semiconductor layer 120 can further comprise a first section 121 and a second section 122 positioned laterally adjacent to the first section 121.

Additionally, the SOI structure 100 can comprise a void 150 (e.g., an air gap, an essentially empty space or opening, etc.) positioned within the semiconductor substrate 101 at the top surface 102 such that it is immediately adjacent to the insulator layer 110 and also aligned below the first section 121 without extending laterally below the second section 122. Optionally, the void 150 can correspond in area (i.e., can be approximately equal in area) to the first section 121.

As a function of one technique used to form such a void 150, the SOI structure 100 can further comprise one or more openings 140 (e.g., one or more vias, through-holes, etc.) extending through the first section 121 and the insulator layer 110 to the void 150. The number of openings 140 extending to the void 150 will depend upon the dimensions (i.e., the width and length) of the void 150 and the isotropic etch process used to form the void 150 (see detailed discussion below). The upper portion of each opening 140 (i.e., the portion of each opening 140 within the semiconductor layer 120) can be filled with an additional semiconductor layer 141 (e.g., an epitaxial single crystalline semiconductor layer, such as an epitaxial silicon layer, epitaxial silicon germanium layer or other suitable epitaxial semiconductor layer). The additional semiconductor layer 141 can comprise either the same semiconductor material as the semiconductor layer 120 or a different semiconductor material. Optionally, each opening 140 can be tapered (as illustrated) so that the upper portion of each opening 140 is wider than the lower portion (i.e., wider than the portion of the opening 140 within the insulator layer 110).

The void 150 below the first section 121 of the semiconductor layer, but not below the second section 122 provides for reduced capacitance coupling between the first section 121 and the substrate 101 as compared to the capacitance coupling between the second section 122 and the substrate 101. Thus, in such an SOI structure 100, the first section 121 may contain a first device and the second section 122 may contain a second device. Due to the sub-insulator layer void 150 positioned below the first section 121, but not below the second section 122, capacitance coupling between the first device and the substrate 101 will be less than capacitance coupling between the second device and the substrate 101.

Figure 2A:
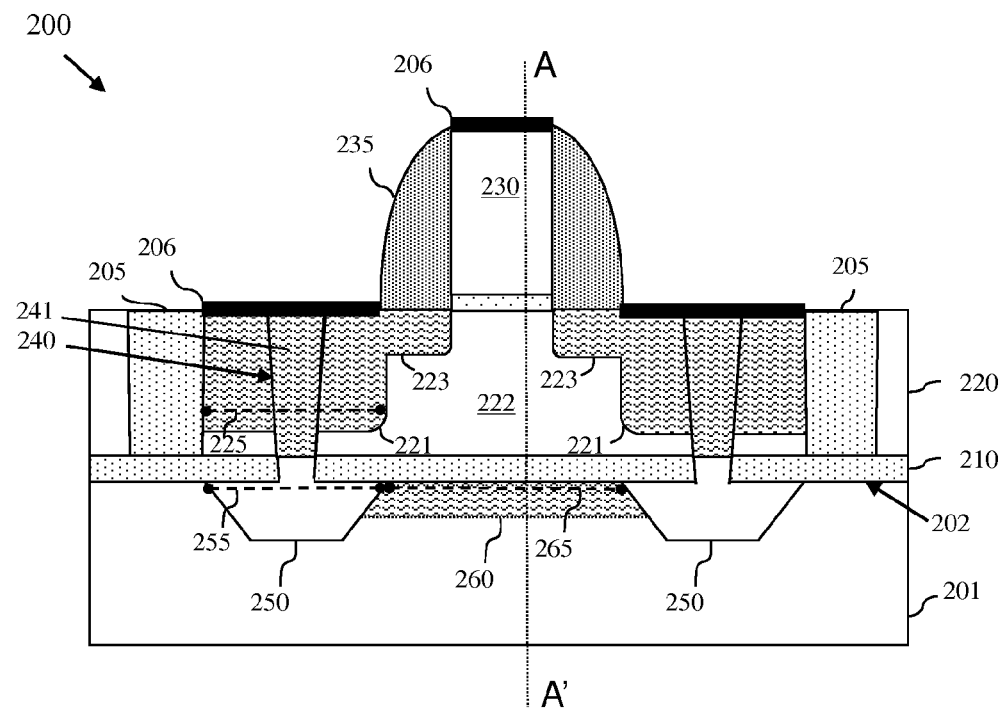
FIG. 2A is a cross-section diagram illustrating an embodiment of an SOI field effect transistor (FET)
Figure 2B:
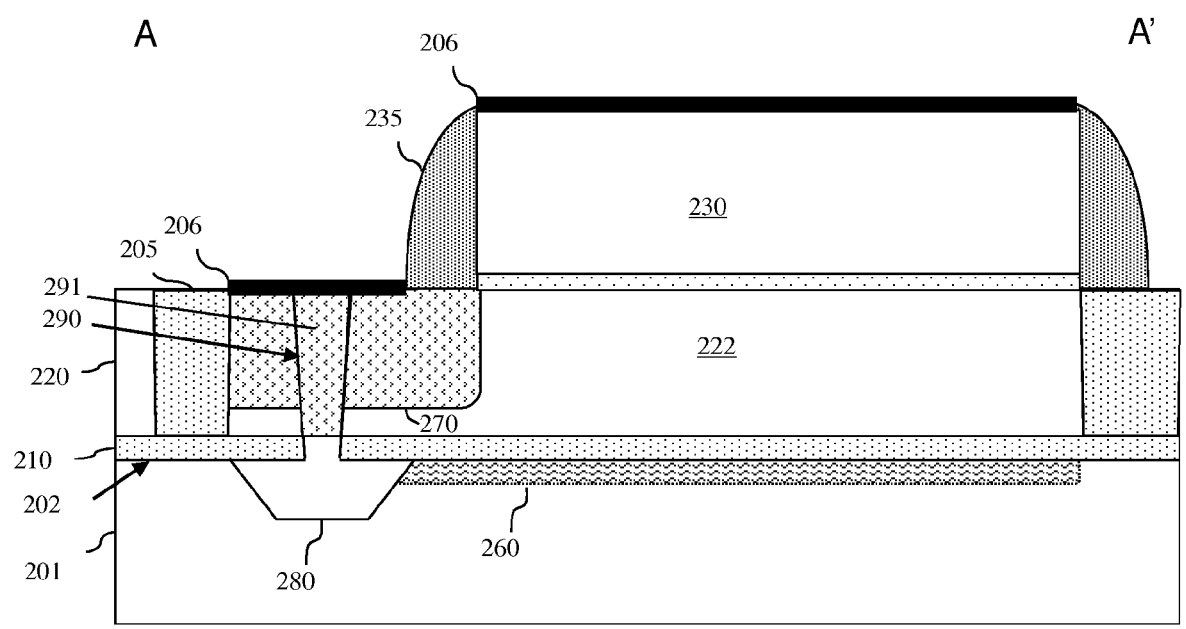
FIG. 2B is a different cross-section diagram illustrating the SOI FET from FIG. 2A.

Alternatively, in such an SOI structure 100, the first and second sections 121, 122 may comprise first and second regions, respectively, of the same device. Due to a sub-insulator layer void 150 positioned below the first section 121, but not below the second section 122, capacitance coupling between the first region of the device and the substrate 101 will be less than capacitance coupling between the second region of the device and the substrate 101. For example, in one particular embodiment as shown in FIGS. 2A-2B, the SOI structure can comprise an SOI field effect transistor (FET) 200 with voids 250 positioned below the source and drain diffusion regions 221 and an optional additional void 280 positioned below a body contact diffusion region 270 so that capacitance coupling between the various diffusion regions 221, 270 and the substrate 201 will be less than capacitance coupling between the channel region 222 and the substrate 201.

Specifically, this SOI FET 200 can comprise a semiconductor substrate 201, an insulator layer 210 on the top surface 202 of the semiconductor substrate 201 and a semiconductor layer 220 on the insulator layer 210. The semiconductor substrate 201 can comprise a silicon substrate or any other suitable semiconductor substrate. The insulator layer 210 can comprise a buried oxide (BOX) layer (e.g., a silicon dioxide ($SiO_2$) layer) or any other suitable insulator layer. The semiconductor layer 220 can comprise a single crystalline semiconductor layer, such as a silicon layer, a silicon germanium layer, or any other semiconductor layer suitable for SOI FET formation.

Shallow trench isolation (STI) regions 205 can extend vertically through the semiconductor layer 220 down to the insulator layer 210. These STIs 205 can define (i.e., can border, laterally surround, etc.) the active area of the transistor 200 and can be filled with one or more isolation materials (e.g., a silicon oxide material, a silicon nitride material, a silicon oxynitride material or any other suitable isolation material or combination thereof).

Within the active area defined by the STIs 205, the semiconductor layer 220 can further comprise source and drain diffusion regions 221 and a channel region 222 positioned laterally between the source and drain diffusion regions 221. The source and drain diffusion regions 221 can comprise N+ diffusion regions in the case of an N-type FET or P+ diffusion regions in the case of a P-type FET. Those skilled in the art will recognize that N+ diffusion regions can be doped with an N-type dopant (e.g., a Group V dopant, such as arsenic (As), phosphorous (P) or antimony (Sb)), whereas P+ diffusion regions can be doped with a P-type dopant (e.g., a Group III dopant, such as boron (B) or indium (In)). Furthermore, various different source and drain diffusion region configurations are well-known in the art (e.g., dopant implant regions, recesses filled with in-situ doped epitaxial semiconductor material, etc.) and can be incorporated into the SOI FET 200.

Additionally, voids 250 (e.g., air gaps, essentially empty spaces or openings, etc.) can be positioned in the semiconductor substrate 201 at the top surface 202 and immediately adjacent to the insulator layer 210. Each void 250 can be aligned below a corresponding one of the source and drain diffusion regions 221 without extending laterally below the channel region 222. Optionally, each void 250 can correspond in area (i.e., can be approximately equal in area) to its corresponding source and drain diffusion region 221. For example, the length 255 and width (not shown) of a void 250 can be approximately equal to the length 225 and width (not shown) of a corresponding source and drain diffusion region 221. Since the voids 250 are positioned below the source and drain diffusion regions 221, but not below the channel region 222, capacitance coupling between the source and drain diffusion regions 221 and the substrate 201 will be less than capacitance coupling between the channel region 222 and the substrate 201. In other words, the voids 250 maximize isolation between the source and drain diffusion regions 221 and the substrate 201 without increasing isolation between the channel region 221 and the substrate 201.

Those skilled in the art will recognize that, if the body or channel region 222 of a planar SOI FET is not contacted, it will tend to float relative to ground such that the threshold voltage, on current, off current and other parameters of the FET may be variable. Thus, referring particularly to FIG. 2B, the SOI FET 200 can further comprise a body contact diffusion region 270 also within the active area defined by the STIs 205. This body contact diffusion region 270 can be positioned laterally immediately adjacent to a side of the channel region 222 running parallel to the channel length and it can have the same conductivity type as the channel region 222 (i.e., a different conductivity type than the source and drain diffusion regions 221). For example, the body contact diffusion region 270 can comprise a P+ diffusion region in the case of an N-type FET or an N+ diffusion regions in the case of a P-type FET. Those skilled in the art will recognize that N+ diffusion regions can be doped with an N-type dopant (e.g., a Group V dopant, such as arsenic (As), phosphorous (P) or antimony (Sb)), whereas P+ diffusion regions can be doped with a P-type dopant (e.g., a Group III dopant, such as boron (B) or indium (In)). Furthermore, various different body contact diffusion region configurations are well-known in the art (e.g., a dopant implant region, a recess filled with an in-situ doped epitaxial semiconductor material, etc.) and can be incorporated into the SOI FET 200.

To limit capacitance coupling between this body contact diffusion region 270 and the substrate 201, the SOI FET 200 can further comprise an optional additional void 280 in the semiconductor substrate 201 at the top surface 202 adjacent to the insulator layer 210. This optional additional void 280 can be aligned below the body contact diffusion region 270 without extending laterally below the channel region 222. Since it is positioned below the body contact diffusion regions 270, but not below the channel region 222, capacitance coupling between the body contact diffusion regions 221 and the substrate 201 will be less than capacitance coupling between the channel region 222 and the substrate 201.

Referring to both FIGS. 2A and 2B, it should be noted that, as function of one technique which can be used to form the voids 250 as well as the optional additional void 280, the SOI FET 200 can further comprise one or more openings 240 (e.g., vias, through-holes, etc.) extending through each source and drain diffusion region 221 and the insulator layer 210 to each void 250 and also, if applicable, one or more additional openings 290 extending through the body contact diffusion region 270 and the insulator layer 210 to the optional additional void 280. The number of openings 240, 290 extending to each void 250, 280 will depend upon the dimensions (i.e., width and length) of the voids 250, 280 and the isotropic etch process used to form them (see detailed discussion below). In one embodiment number and location of the openings 240, 290 can correspond to the number and locations of the contact vias to the diffusion regions 221, 270.

Additionally, each opening 240 can be filled with an additional semiconductor layer 241 (e.g., an epitaxial single crystalline semiconductor layer, such as an epitaxial silicon, an epitaxial silicon germanium layer or other suitable epitaxial semiconductor layer) having a same conductivity type as the source and drain diffusion region 221, whereas each opening 290 can be filled with an additional semiconductor layer 291 (e.g., an epitaxial single crystalline semiconductor layer, such as epitaxial silicon layer, an epitaxial silicon germanium layer or other suitable epitaxial semiconductor layer) having a same conductivity type as the body contact diffusion region 321. The additional semiconductor layers 241 291 may comprise the same or a different semiconductor material than the semiconductor layer 220. Optionally, the openings 240, 290 can be tapered (as illustrated) so that the upper portion of each opening 240, 290 (i.e., the portion of each opening 240, 290 within the semiconductor layer 220) is wider than the lower portion (i.e., the portion within the insulator layer 210).

Optionally, this SOI FET 200 can further comprise a back gate electrode 260 in the semiconductor substrate 201 at the top surface 202. Specifically, this back gate electrode 260 can be positioned immediately adjacent to the insulator layer 210 and can be aligned below the channel region 222. Thus, the back gate electrode 260 is positioned laterally between the voids 250. If the voids 250 extend through the back gate electrode 260, the gate length 265 of the back gate electrode 260 will be defined by the voids 250 (i.e., will be equal to the distance between the voids 250). This back gate electrode 260 can comprise, for example, a dopant implant region having a same conductivity type as the source and drain diffusion regions 221. However, various different back gate electrode configurations are well-known in the art (e.g., back gate electrodes comprising discrete in-situ doped semiconductor layers formed between the substrate and insulator layer of an SOI wafer) and can alternatively be incorporated into the SOI FET structure 200.

Additional components of the SOI FET 200 can include, but are not limited to, a front gate structure 230 above the channel region 222, source/drain extension regions 223, gate sidewall spacers 235 on the front gate electrode 230, source/drain extension regions 223 below the gate sidewall spacers 235, halo regions (not shown), silicide layers 206 on the front gate structure 230 and on the diffusion regions 221, 270, interlayer dielectrics, contacts, etc. Such SOI FET components are well-known in the art and, thus, the details are omitted from this specification in order to allow the reader to focus on the salient aspects of the embodiments described.

Thus, in the SOI structure embodiments 100 and 200 described above and illustrated in FIGS. 1 and 2A-B, capacitance coupling between devices and/or device regions and the substrate can be selectively minimized by using selectively placed sub-insulator layer voids. Furthermore, since capacitance coupling is selectively minimized, where necessary, a thinner than typical insulator layer (e.g., an insulator layer ranging in thickness from 5-100 nm) can also be incorporated into the SOI structure 100, 200 in order maximize capacitance coupling between other devices and/or other device regions and the substrate.

Figure 3:
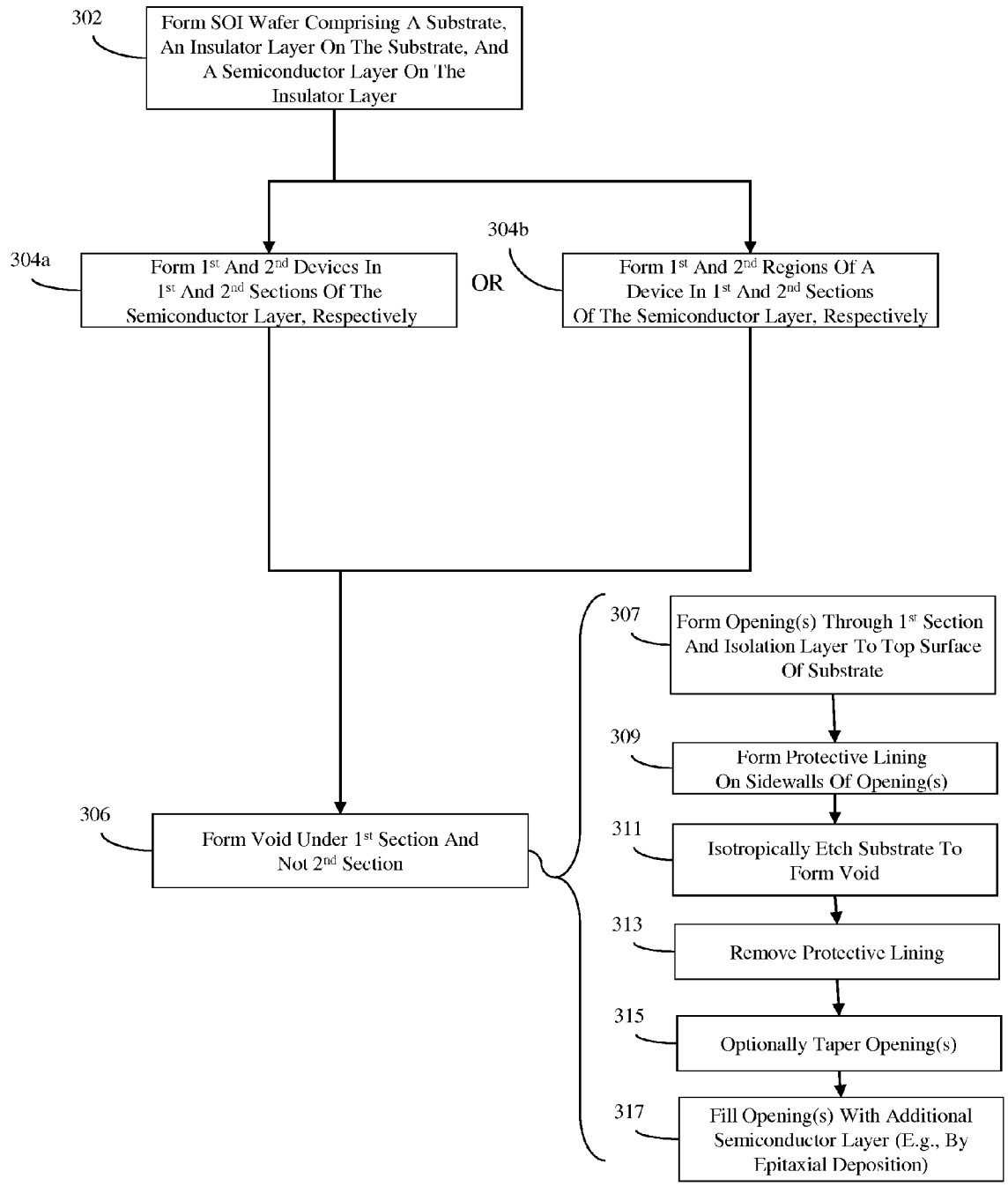
FIG. 3 is a flow diagram illustrating an embodiment of a method of forming an SOI structure.
Figure 4:
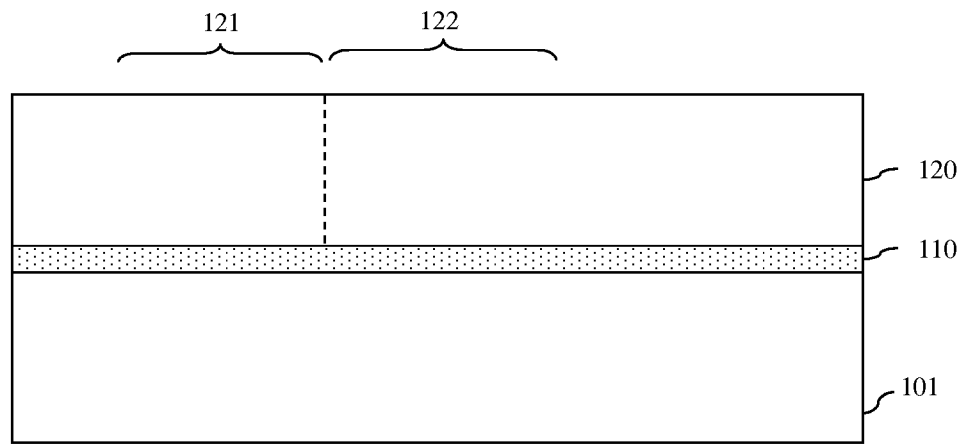
FIG. 4 is a cross-section diagram illustrating a partially completed SOI structure formed according to the method of FIG. 3.

Referring to FIG. 3, also disclosed herein are embodiments of a method of forming the above-described semiconductor-on-insulator (SOI) structure 100, as shown in FIG. 1. The method can comprise forming a semiconductor-on-insulator (SOI) wafer (402, see FIG. 4). This SOI wafer can comprise a semiconductor substrate 101, an insulator layer 110 on the top surface 102 of the semiconductor substrate 101, and a semiconductor layer 120 on the insulator layer 110. The semiconductor substrate 101 can comprise a silicon substrate or any other suitable semiconductor substrate. The insulator layer 110 can comprise a buried oxide (BOX) layer (e.g., a silicon dioxide ($SiO_2$) layer) or any other suitable insulator layer. The semiconductor layer 120 can comprise a single crystalline semiconductor layer, such as a silicon layer, a silicon germanium layer, or any other semiconductor layer suitable SOI device formation. Techniques for forming SOI wafers (e.g., separated by implanted oxygen (SIMOX) wafers, bonded wafers, etc.) are well-known in the art and, thus, the details are omitted from this specification in order to allow the reader to focus on the salient aspects of the embodiments described.

The method can further comprise forming a void 150 in the semiconductor substrate 101 (306, see FIG. 1). Specifically, this void 150 can be formed at the top surface 102 of the semiconductor substrate 101 immediately adjacent to the insulator layer 110 and aligned below a first section 121 of the semiconductor layer 120 without extending laterally below a second section 122 of the semiconductor layer 120. Optionally, the void 150 can be formed at process 306 such that it corresponds in area (i.e., so that it is approximately equal in area) to the first section 121.

Figure 5:
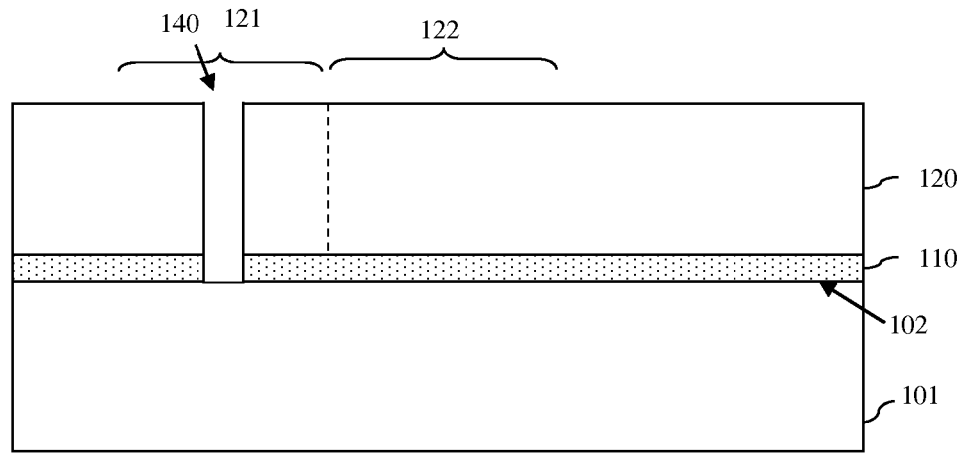
FIG. 5 is a cross-section diagram illustrating a partially completed SOI structure formed according to the method of FIG. 3.

To form such a void 150, the method can comprise first forming at least one opening 140 extending vertically through the first section 121 and the insulator layer 110 to the top surface 102 of the substrate 101 (307, see FIG. 5). The one or more openings 140 can, for example, be patterned and etched using conventional lithographic processing techniques. The number of the opening(s) 140 as well as their locations will depend upon the desired size (i.e., length, width and depth) of the void 150, given the isotropic etch process that will subsequently be used at process 311 to etch the void 150 into the substrate 101.

Figure 6:
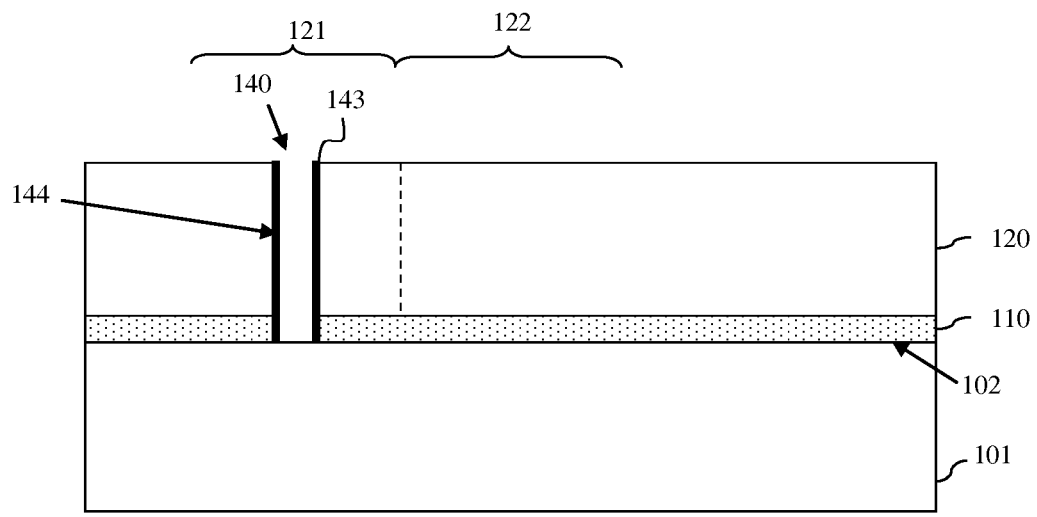
FIG. 6 is a cross-section diagram illustrating a partially completed SOI structure formed according to the method of FIG. 3.

Next, the sidewalls 144 of the opening(s) 140 can be lined with a protective film 143 (309, see FIG. 6). For example, a polymer film can be formed on the sidewalls 144 using conventional polymer spacer formation techniques.

Figure 7:
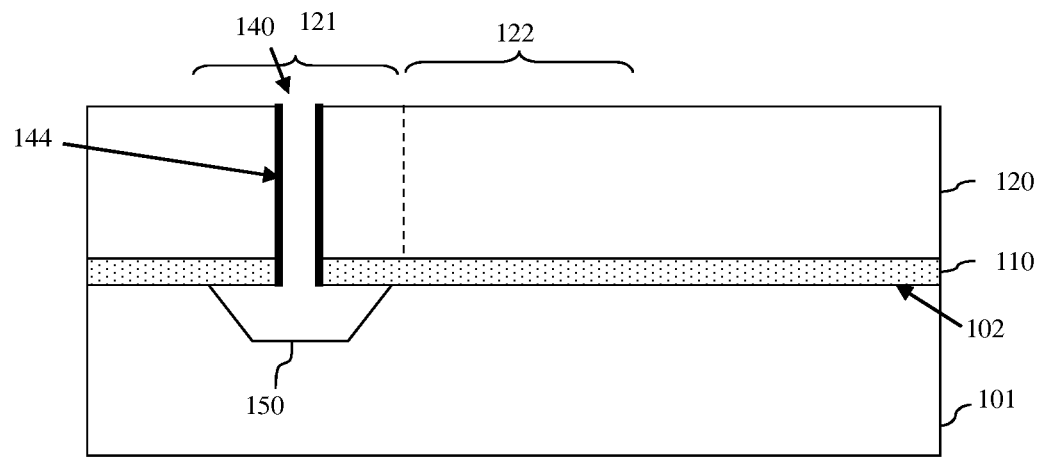
FIG. 7 is a cross-section diagram illustrating a partially completed SOI structure formed according to the method of FIG. 3.

After the protective film 143 is formed, an isotropic etch process can be performed in order to form the void 150, as described above (311, see FIG. 7). Such an isotropic etch process can comprise, for example, an isotropic wet etch process, which is selective to silicon and which involves exposing the substrate 101 at the bottom of the openings 140 to a wet hydroxide etchant, such as tetramethylammonium hydroxide, ammonium hydroxide, sodium hydroxide, or potassium hydroxide. This isotropic etch process 311 will etch the substrate at essentially the same rate in all directions. Thus, the maximum desired depth for the void 150 may dictate the number of openings 140 required to be formed at process 307 in order to achieve the desired area dimensions when etching the void 150 at process 311.

Figure 8:
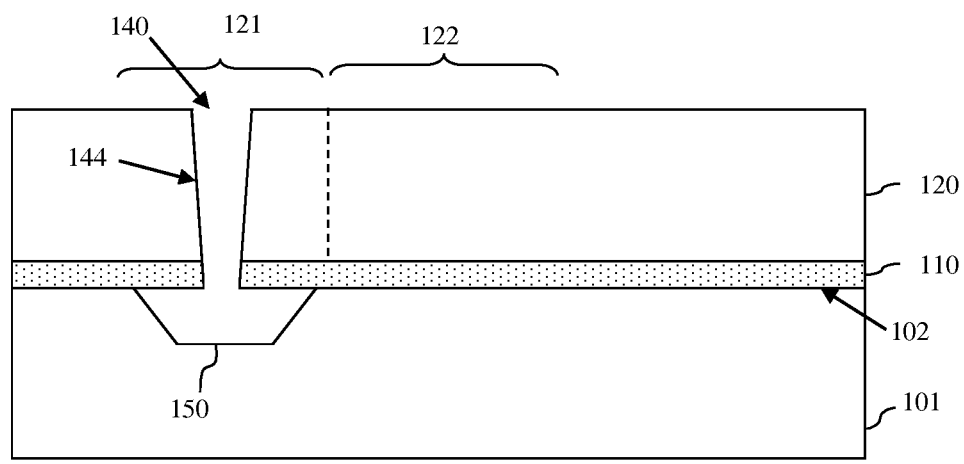
FIG. 8 is a cross-section diagram illustrating a partially completed SOI structure formed according to the method of FIG. 3.

Next, the protective film 143 can be selectively removed (e.g., by a hot phosphoric acid ($H_3PO_4$) etch process. Such a $H_3PO_4$ etch process may taper the opening(s) 140 such that the upper portion of each opening 140 (i.e., the portion within the semiconductor layer 120) is wider than the lower portion (i.e., the portion within the insulator layer 110) (313). Optionally, an additional etch process (e.g., a short reactive ion etch (RIE) process) can be performed in order to taper or further define the taper of the opening(s) 140 (315, see FIG. 8). Once the protective liner 143 is removed and the opening(s) 140 are optionally tapered, the upper portion of each opening 140 can be filled with an additional semiconductor layer 141 (e.g., a silicon layer, a silicon germanium layer or any other suitable semiconductor layer) (317, see FIG. 1). Filling the upper portion of each opening 140 with the additional semiconductor layer 141 can be accomplished using an epitaxial deposition process and the additional semiconductor layer can comprise either the same or a different semiconductor material than the semiconductor layer 120. It should be noted that tapering the opening(s) 140 ensures that, during epitaxial deposition at process 317, the opening(s) 140 close off at the junction between the insulator layer 110 and semiconductor layer 120 first, thereby preventing the void 150 from being filled as the opening(s) 140 are being filled.

By forming such a void 150 below the first section 121 of the semiconductor layer, but not below the second section 122, capacitance coupling between the first section 121 and the substrate 101 will be less than capacitance coupling between the second section 122 and the substrate 101. Thus, the method allows for selective positioning of a sub-insulator layer void 150 in order to selectively adjust capacitance coupling between a given device and the substrate 101 or between a given device region and the substrate 101. That is, the method can also comprise forming a first device in the first section 121 of the semiconductor layer 120 and a second device in the second section 122 of the semiconductor layer (304*a*). Thus, a sub-insulator layer void 150 selectively placed below the first section 121 of the semiconductor layer 120, but not below the second section 122, ensures that capacitance coupling between the first device 121 and the substrate 120 will be less than capacitance coupling between the second device 120 and the substrate 101. Alternatively, the method can also comprise forming first and second regions of the same device within the first and second sections 121, 122, respectively (304*b*). Thus, a sub-insulator layer void 150 selectively placed below the first section 121 of the semiconductor layer 120, but not below the second section 122, ensures that capacitance coupling between the first region of the device and the substrate 101 will be less than capacitance coupling between the second region of the same device and the substrate 101.

Figure 9:
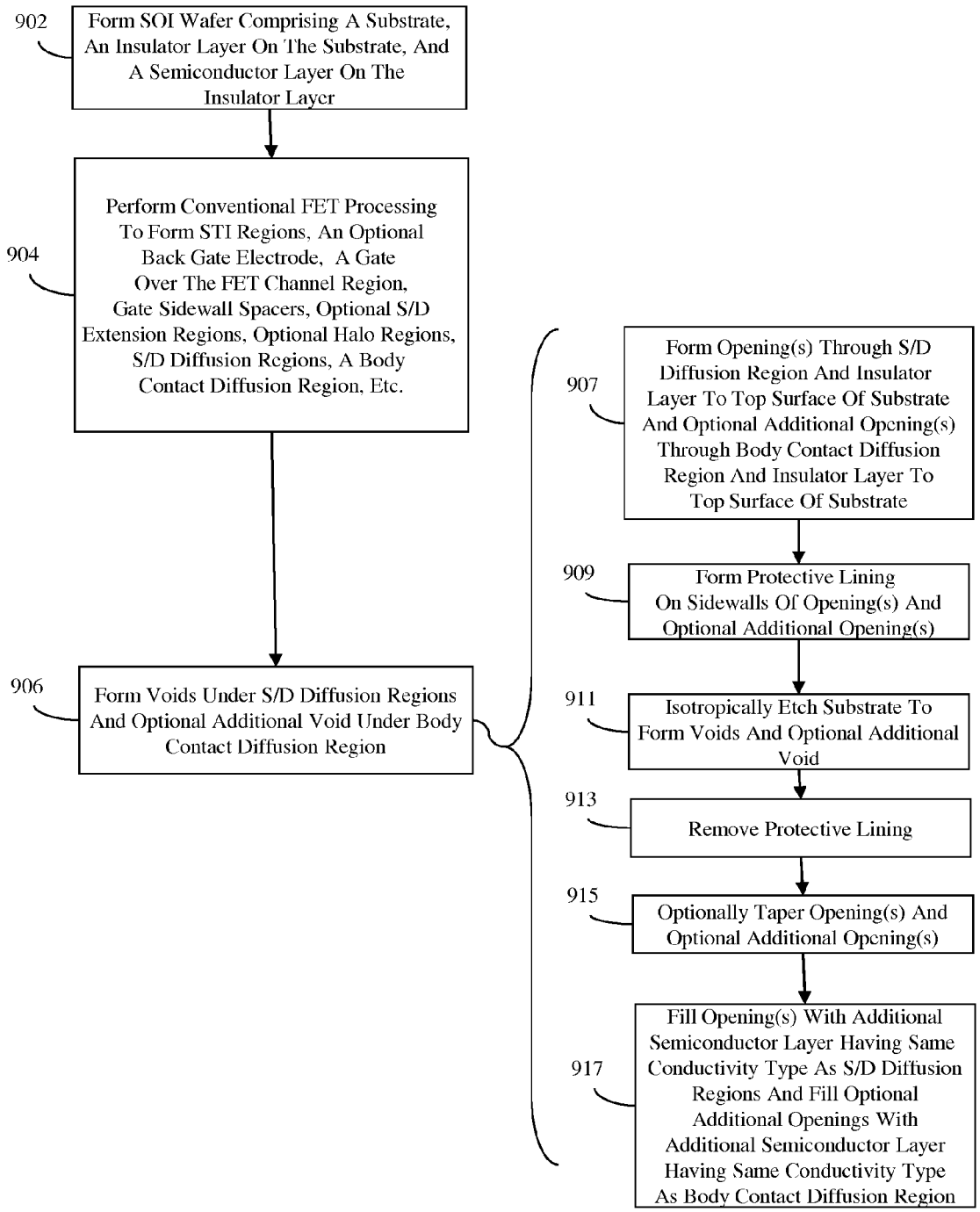
FIG. 9 is a flow diagram illustrating an embodiment of a method of forming an SOI FET structure.

For example, referring to FIG. 9, in one particular embodiment, the method of forming an SOI structure can comprise forming an SOI field effect transistor (FET) 200, as shown in FIGS. 2A-2B. In this embodiment, the method can similarly comprise forming a semiconductor-on-insulator (SOI) wafer (902, see FIG. 10). This SOI wafer can comprise a semiconductor substrate 201, an insulator layer 210 on the top surface 1202 of the semiconductor substrate 201, and a semiconductor layer 220 on the insulator layer 210. The semiconductor substrate 201 can comprise a silicon substrate or any other suitable semiconductor substrate. The insulator layer 210 can comprise a buried oxide (BOX) layer (e.g., a silicon dioxide ($SiO_2$) layer) or any other suitable insulator layer. The semiconductor layer 220 can comprise a single crystalline semiconductor layer, such as a silicon layer, a silicon germanium layer, or any other semiconductor layer suitable SOI device formation. Techniques for forming SOI wafers (e.g., separated by implanted oxygen (SIMOX) wafers, bonded wafers, etc.) are well-known in the art and, thus, the details are omitted from this specification in order to allow the reader to focus on the salient aspects of the embodiments described.

The method can further comprise performing conventional planar field effect transistor (FET) processing (904). For example, shallow trench isolation (STI) regions 205 that extend vertically through the semiconductor layer 220 to the insulator layer 210 and that define the active area of the transistor 200 can be formed (see FIG. 10). That is, using conventional lithographic processing techniques, shallow trenches can be patterned and etched into the semiconductor layer 1220 around (i.e., bordering) an area designated as the active area of the transistor 200. These shallow trenches can then be filled (e.g., by chemical vapor deposition (CVD) followed by chemical mechanical planarization (CMP) with one or more isolation materials (e.g., a silicon oxide material, a silicon nitride material, a silicon oxynitride material or any other suitable isolation material or combination thereof).

Figure 10:
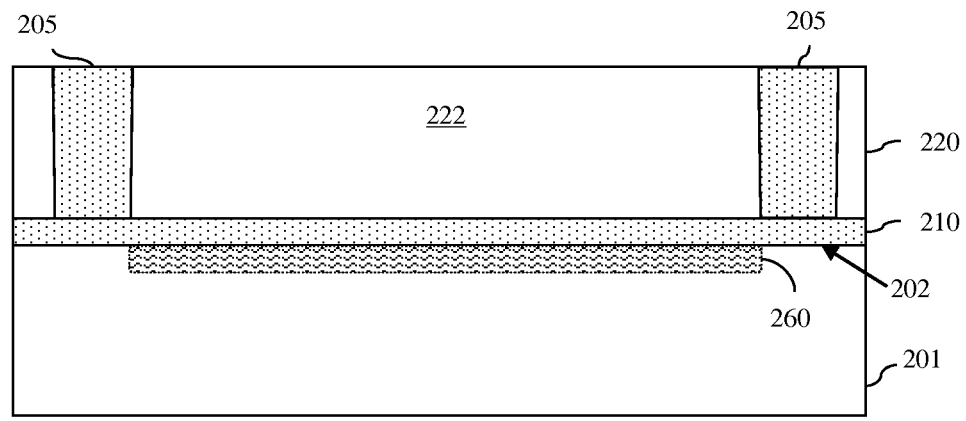
FIG. 10 is a cross-section diagram illustrating a partially completed SOI FET formed according to the method of FIG. 9.

Optionally, conventional planar FET processing 904 can include the formation, either before or after STI 205 formation, of a back gate electrode 260 in the semiconductor substrate 201 at the top surface 202 (see FIG. 10). Specifically, a back gate electrode 260 can be formed so that it positioned immediately adjacent to the insulator layer 210, so that it is aligned below a designated channel region 222 and so that it will have the same conductivity type as the source and drain diffusion regions that will subsequently be formed (i.e., so that it has an N-type conductivity in the case of an N-type FET or a P-type conductivity in the case of a P-type FET).

One technique for forming such a back gate electrode 260 can comprise performing a dopant implantation process in order to form, in the desired location, an implant region appropriately doped with either an N-type dopant (e.g., a Group V dopant, such as arsenic (As), phosphorous (P) or antimony (Sb)) or a P-type dopant (e.g., a Group III dopant, such as boron (B) or indium (In)). However, other techniques for forming a back gate electrode 260 are also well-known in the art (e.g., forming a discrete appropriately doped semiconductor layer between the semiconductor substrate and the insulator layer during SOI wafer formation) and can alternatively be incorporated into the method embodiments disclosed herein.

Figure 11:
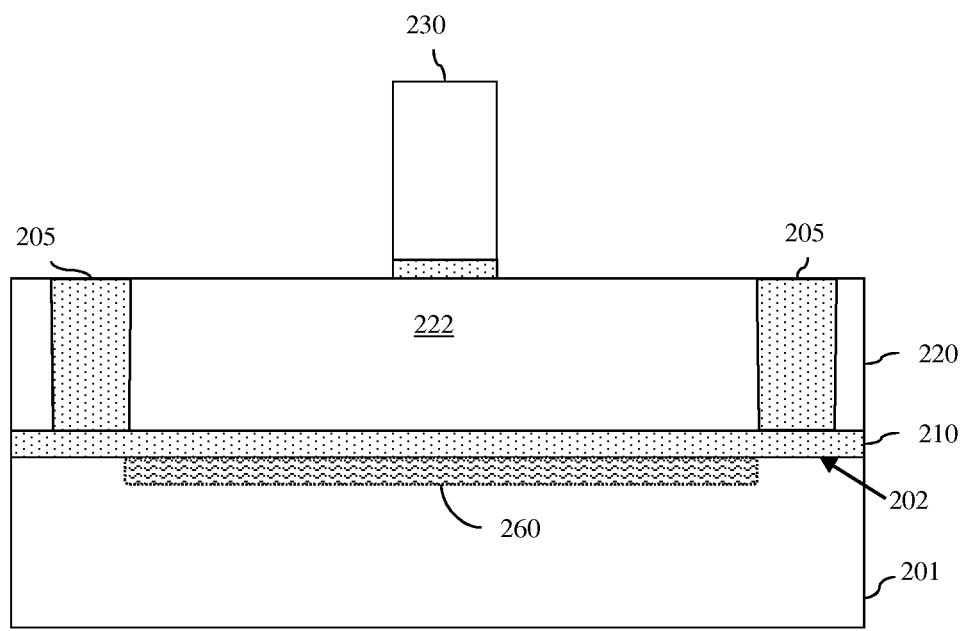
FIG. 11 is a cross-section diagram illustrating a partially completed SOI FET formed according to the method of FIG. 9.

Next, a front gate structure 230 can be formed over the designated channel region 222 opposite the optional back gate electrode 260 (see FIG. 11). That is, a gate dielectric layer (e.g., an oxide layer, a high-k gate dielectric layer or any other suitable gate dielectric layer) can be deposited on the semiconductor layer 220. Then, a gate conductor layer (e.g., a polysilicon layer, a metal layer or any other suitable gate conductor layer) can be deposited on the gate dielectric layer. The gate conductor layer-gate dielectric layer stack can then be patterned and etched using conventional lithographic techniques in order to form the front gate structure 230.

Figure 12A:
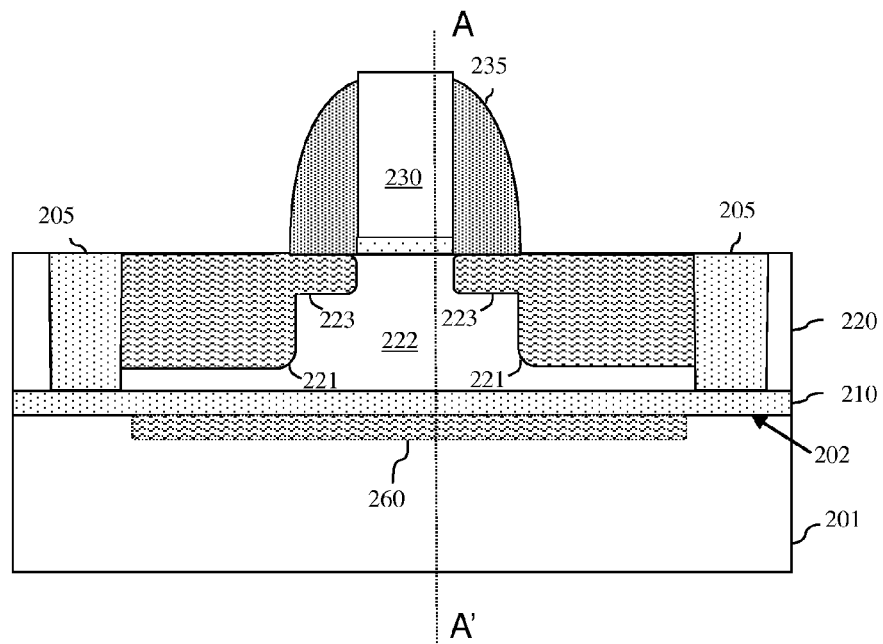
FIG. 12A is a cross-section diagram illustrating a partially completed SOI FET formed according to the method of FIG. 9.
Figure 12B:
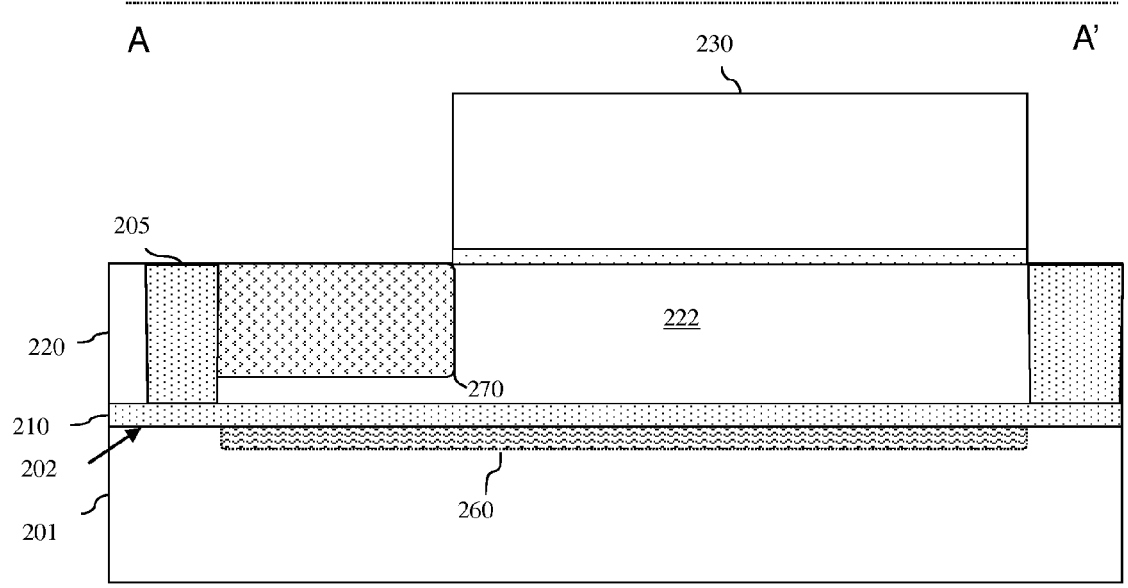
FIG. 12B is a different cross-section diagram illustrating the partially completed SOI FET from FIG. 12A.

After the STIs 205, optional back gate electrode 260 and the front gate structure 230 are formed, various other FET components can be formed at process 904, such as source and drain extension regions 223, halo regions (not shown), gate sidewall spacers 235, source and drain diffusion regions 221 on opposing sides of the channel region 222 perpendicular to the channel length (see FIG. 12A) and a body contact diffusion region 270 on another side of the channel region 222 parallel to the channel length (see FIG. 12B). It should be noted that, as formed, the source and drain diffusion regions 221 should comprise N+ diffusion regions in the case of an N-type FET or P+ diffusion regions in the case of a P-type FET. Contrarily, as formed, the body contact diffusion region 270 should comprise a P+ diffusion region in the case of an N-type FET or an N+ diffusion region in the case of a P-type FET. That is, the body contact diffusion region should have the same conductivity type as the channel region 222 and a different conductivity type than the source and drain diffusion regions 221. Those skilled in the art will recognize that N+ diffusion regions can be doped with an N-type dopant (e.g., a Group V dopant, such as arsenic (As), phosphorous (P) or antimony (Sb)), whereas P+ diffusion regions can be doped with a P-type dopant (e.g., a Group III dopant, such as boron (B) or indium (In)). Furthermore, various different techniques for forming such N+ or P+ diffusion regions 221, 270 are well known in the art (e.g., forming dopant implant regions, forming recesses filled with in-situ doped epitaxial semiconductor material, etc.) and can be incorporated into the method embodiments disclosed herein.

The method can further comprise forming voids 250 and an optional additional void 280 in the semiconductor substrate 201 at the top surface 202 adjacent to the insulator layer 210 (906, FIGS. 2A and 2B). The voids 250 can be formed such that each one is aligned below a corresponding one of the source and drain diffusion regions 221 without extending laterally below the channel region 222. Optionally, the voids 250 can be formed so that each void 250 corresponds in area (i.e., is approximately equal in area) to its corresponding source and drain diffusion region 221. It should be noted that if, at process 904, a back gate electrode 260 is formed and if the voids 250 extend through the back gate electrode 260, then the gate length 265 of the back gate electrode 260 will be defined by the voids 250 (i.e., will be equal to the distance between the voids 250). The optional additional void 280 can be formed such that it is aligned below the body contact diffusion region 270 without extending laterally below the channel region 222.

Figure 13A:
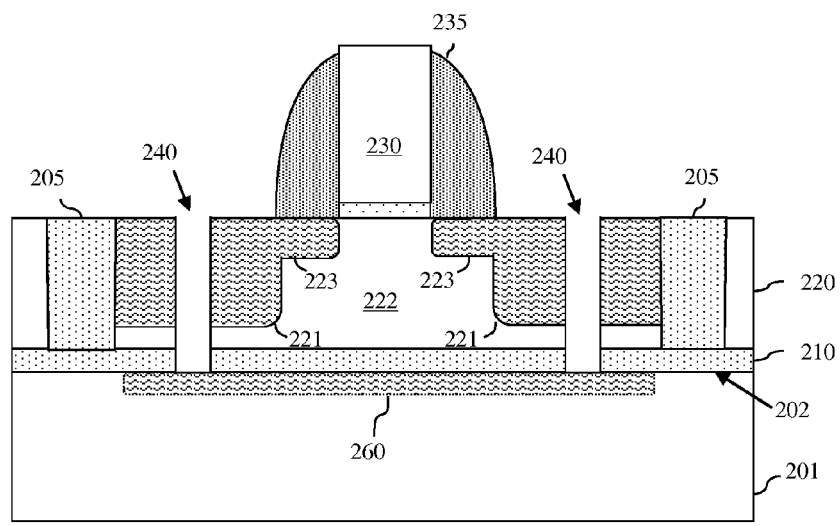
FIG. 13A is a cross-section diagram illustrating a partially completed SOI FET formed according to the method of FIG. 9.
Figure 13B:
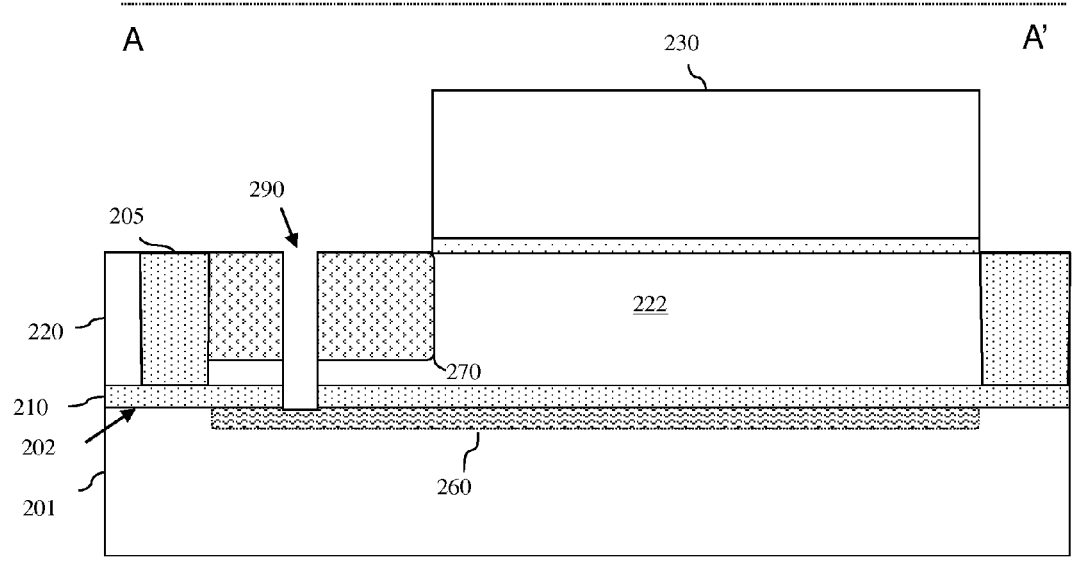
FIG. 13B is a different cross-section diagram illustrating the partially completed SOI FET from FIG. 13A.

To form the voids 250, the method can comprise forming at least one opening 240 extending vertically through each source and drain diffusion region 221 and the insulator layer 210 to the top surface 202 of the substrate 201 (907, see FIG. 13A). To form the optional additional void 280, at least one additional opening 290 extending vertically through the body contact diffusion region 270 and the insulator layer 210 to the top surface 202 of the substrate 201 can simultaneously be formed at process 907 (see FIG. 13B). The openings 240, 290 can, for example, be patterned and etched using conventional lithographic techniques. The number of the openings 240, 290 as well as their locations will depend upon the desired size (i.e., length, width and depth) of the voids 250, 280, given the isotropic etch process that will subsequently be used at process 911 to etch the voids 250, 280 into the substrate 201. In one embodiment, the openings 240, 290 can correspond in number and location to the contact vias for the different diffusion regions 221, 270. Thus, the openings 240, 290 can be created at process 901 using the same mask as subsequently used to create the contact vias. By using the contact via mask during sub-insulator layer void formation, any area penalty associated with void formation is minimized or eliminated.

Figure 14A:
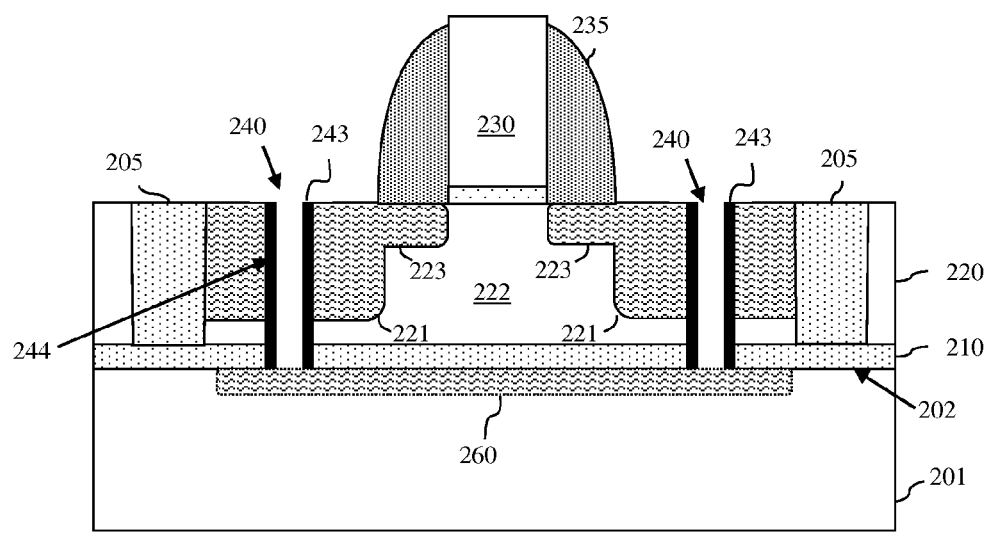
FIG. 14A is a cross-section diagram illustrating a partially completed SOI FET formed according to the method of FIG. 9.
Figure 14B:
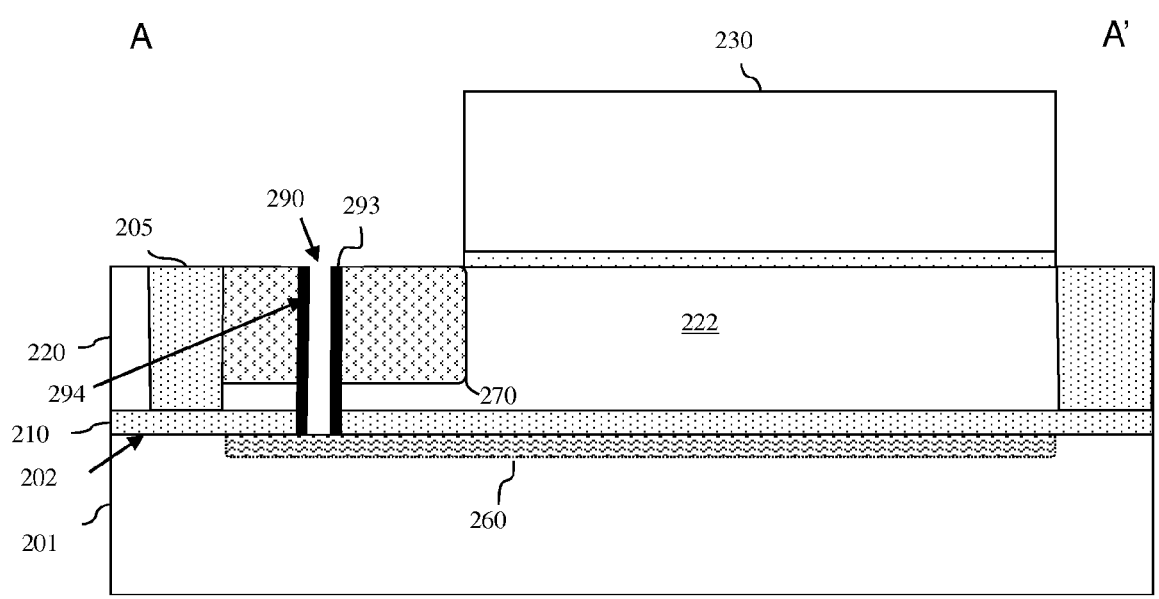
FIG. 14B is a different cross-section diagram illustrating the partially completed SOI FET from FIG. 14A.

Then, the sidewalls 244 of the openings 240 and, if applicable, the sidewalls 294 of any openings 290 can be lined with a protective film 243, 293 (909, see FIGS. 14A and 14B). For example, a polymer film can be formed on the sidewalls 244, 294 using conventional polymer spacer formation techniques.

Figure 15A:
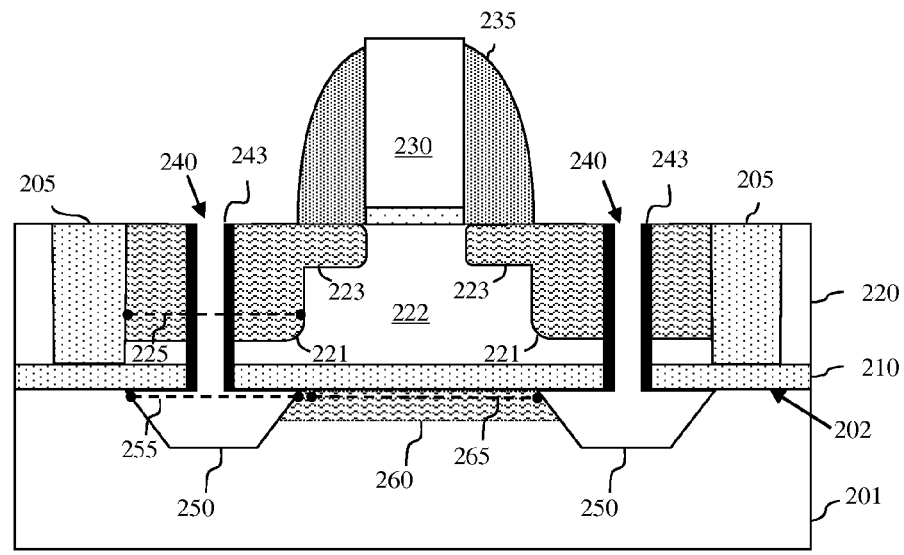
FIG. 15A is a cross-section diagram illustrating a partially completed SOI FET formed according to the method of FIG. 9.
Figure 15B:
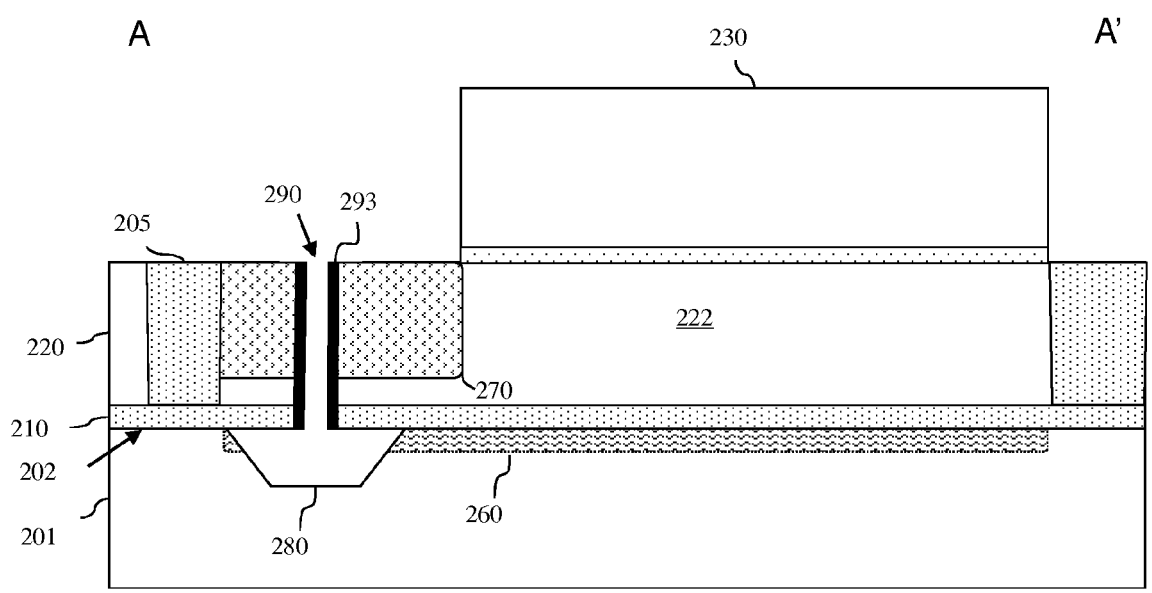
FIG. 15B is a different cross-section diagram illustrating the partially completed SOI FET from FIG. 15A.

After the protective film is formed, an isotropic etch process can be performed in order to form the voids 250 and, if applicable, the additional void 280, as described above (911, see FIGS. 15A and 15B). Such an isotropic etch process can comprise, for example, an isotropic wet etch process, which is selective to silicon and which involves exposing the substrate 201 at the bottom of the openings to a wet hydroxide etchant, such as tetramethylammonium hydroxide, ammonium hydroxide, sodium hydroxide, or potassium hydroxide. This isotropic etch process 911 will etch the substrate 201 at essentially the same rate in all directions. Thus, the maximum desired depth for the voids 250, 280 may dictate the number of openings 240, 290 required to be formed at process 907 in order to achieve the desired area dimensions when etching the voids 250, 280 at process 911.

Figure 16A:
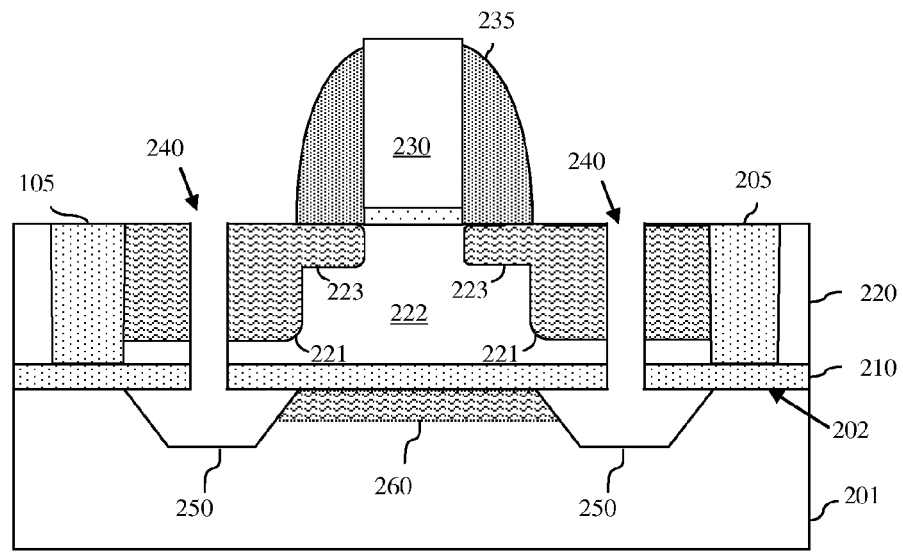
FIG. 16A is a cross-section diagram illustrating a partially completed SOI FET formed according to the method of FIG. 9.
Figure 16B:
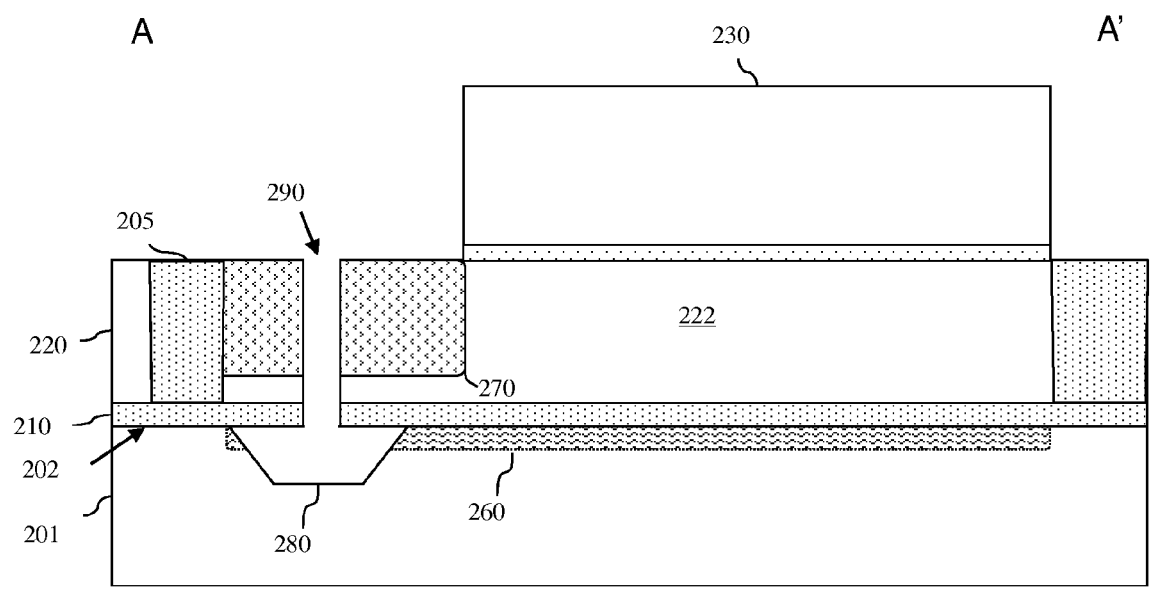
FIG. 16B is a different cross-section diagram illustrating the partially completed SOI FET from FIG. 16A.
Figure 17A:
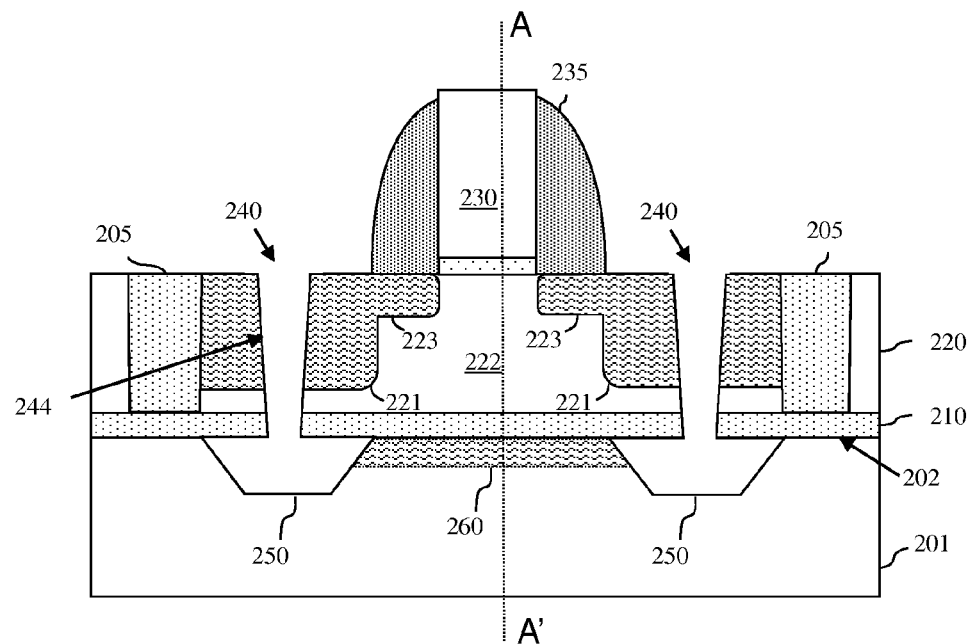
FIG. 17A is a cross-section diagram illustrating a partially completed SOI FET formed according to the method of FIG. 9.
Figure 17B:
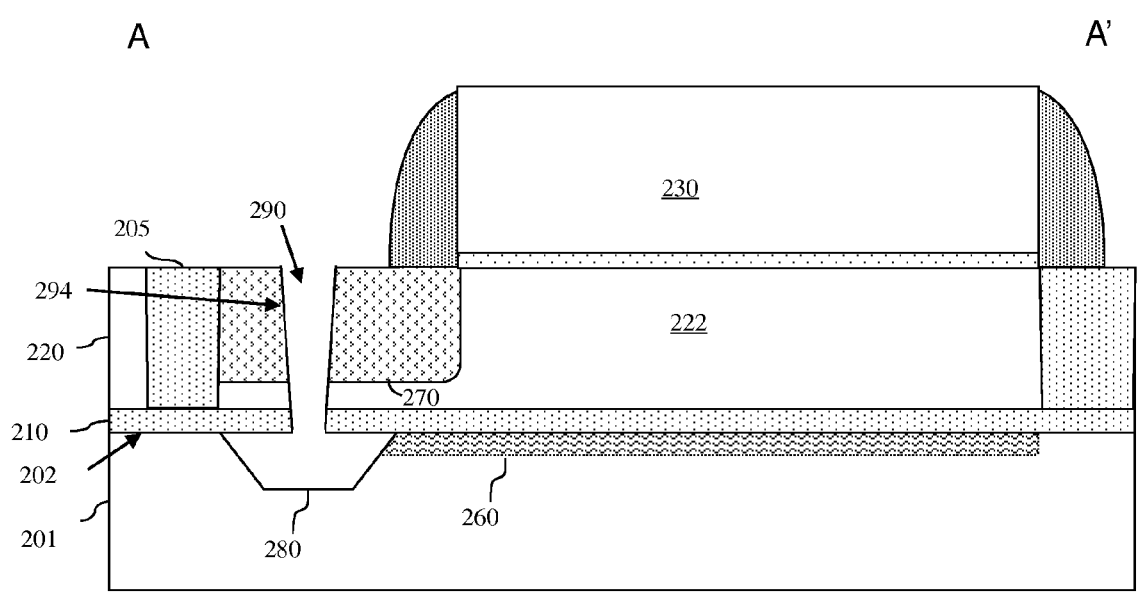
FIG. 17B is a different cross-section diagram illustrating the partially completed SOI FET from FIG. 17A.

Next, the protective film 243, 290 can be selectively removed (913, see FIGS. 16A and 16B). Then, optionally, an additional etch process (e.g., a short reactive ion etch (RIE) process) can be performed in order to taper the sidewalls 244, 294 of all openings 240, 290 such that the upper portion of each opening 240, 290 (i.e., the portion within the semiconductor layer 220) is wider than the lower portion (i.e., the portion within the insulator layer 210) (915, see FIGS. 17A and 17B).

Figure 18A:
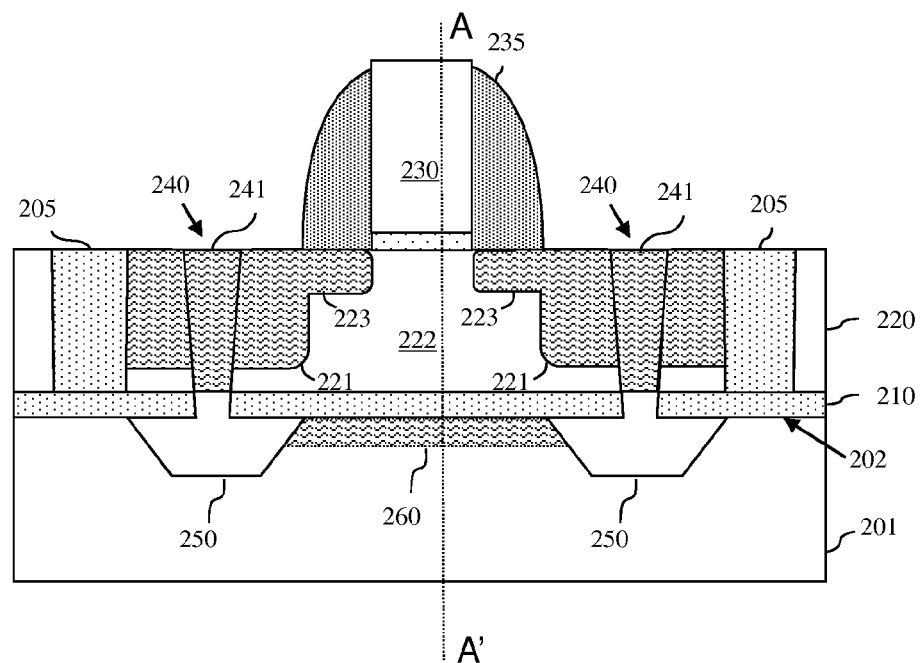
FIG. 18A is a cross-section diagram illustrating a partially completed SOI FET formed according to the method of FIG. 9.
Figure 18B:
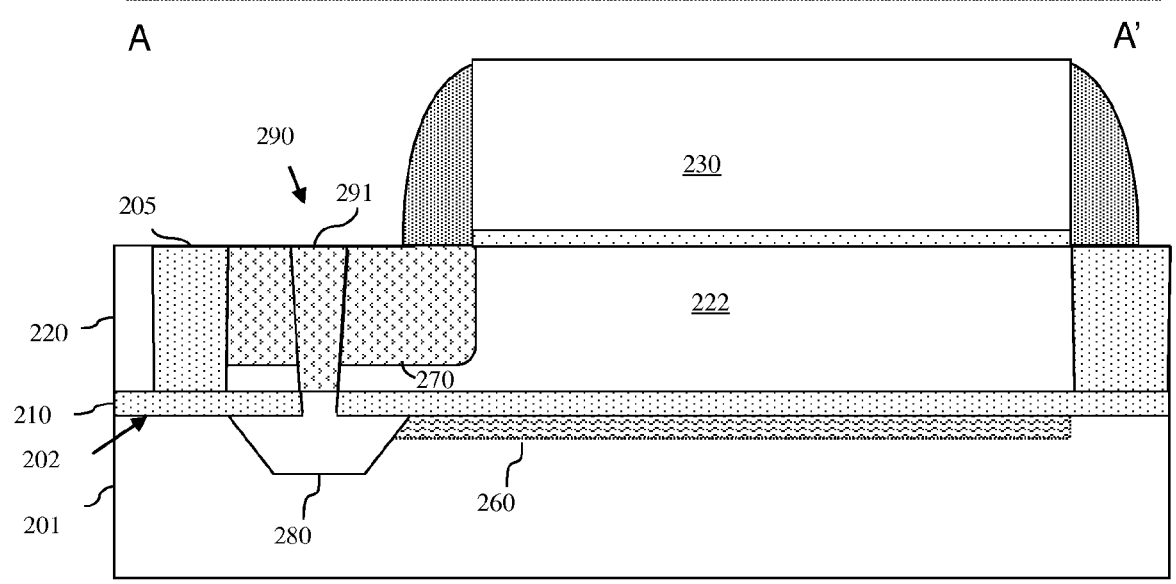
FIG. 18B is a different cross-section diagram illustrating the partially completed SOI FET from FIG. 18A.

Finally, the upper portion of each opening 240 (i.e., the portion within the semiconductor layer 220) can be filled with an additional semiconductor layer 241 (e.g., an additional silicon layer, additional silicon germanium layer or any other suitable additional semiconductor layer) having a same conductivity type as the source and drain diffusion regions 221, whereas the upper portion of any opening 290 (i.e., the portion within the semiconductor layer 220) can be filled another additional semiconductor layer 291 (e.g., an additional silicon layer, additional silicon germanium layer or any other suitable additional semiconductor layer) having a same conductivity type as the body contact diffusion region 270 (917, see FIGS. 18A and 18B). The upper portions of the openings 240 and of any additional openings 290 can be filled with additional semiconductor layers 241, 291, respectively, having different conductivity types, by using discrete epitaxial deposition processes, which include in-situ doping with the appropriate conductivity type dopant. It should be noted that tapering the openings 240, 290 at process 915 ensures that, during epitaxial deposition at process 917, the openings 240, 290 close off at the junction between the insulator layer 210 and semiconductor layer 220 first, thereby preventing the voids 250, 280 from being filled as the openings 240, 290 are being filled.

By forming such voids 250 below the source and drain diffusion regions 221 and not below the channel region 222, capacitance coupling between the source and drain diffusion regions 221 and the substrate 201 will be less than capacitance coupling between the channel region 222 and the substrate 201. Similarly, by forming the optional additional void 280 below the body contact diffusion region 270 and not below the channel region 222, capacitance coupling between the body contact diffusion region 270 and the substrate 201 will be less than capacitance coupling between the channel region 222 and the substrate 201. Thus, the method allows for selective positioning of sub-insulator layer voids 250, 280 in order to selectively reduce capacitance coupling between one or more device diffusion regions 221, 270 and the substrate 201, while promoting capacitance coupling between the device channel region 222 and the substrate 201.

After the voids 250 and, if applicable, the optional additional void 280 are formed at process 906, additional conventional SOI FET processing can be performed in order to complete the SOI FET 200 structure. Such additional FET processing can include, but is not limited to, formation of a front gate structure 230 above the channel region 222, formation of source/drain extension regions 223, silicide layer 206 formation on the front gate structure 230 and on the diffusion regions 221, 270, interlayer dielectric deposition, contact formation, metal layer formation, etc. (see FIGS. 2A and 2B). Such SOI FET processing is well-known in the art and, thus, the details are omitted from this specification in order to allow the reader to focus on the salient aspects of the embodiments described.

Thus, in the SOI method embodiments described above, capacitance coupling between devices and/or device regions and the substrate can be selectively minimized by using selectively placed sub-insulator layer voids formed at processes 306 and 906 of FIGS. 3 and 9, respectively. Furthermore, since capacitance coupling can be selectively minimized, where necessary, a thinner than typical insulator layer (e.g., an insulator layer ranging in thickness from 5-100 nm) can also be incorporated into the SOI wafer formed at processes 302 and 902 of FIGS. 3 and 9, respectively, in order maximize capacitance coupling between other devices and/or other device regions and the substrate.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of a semiconductor-on-insulator (SOI) structure having sub-insulator layer void(s) selectively placed in a substrate so that capacitance coupling between a first section of a semiconductor layer and the substrate will be less than capacitance coupling between a second section of the semiconductor layer and the substrate. Specifically, the first section may contain a first device on an insulator layer and the second section may contain a second device on the insulator layer. A sub-insulator layer void selectively placed in the substrate below the first device and not below the second device ensures that capacitance coupling between the first device and the substrate will be less than capacitance coupling between the second device and the substrate. Alternatively, the first and second sections may comprise different regions of the same device. A sub-insulator layer void selectively placed in the substrate below a first region of a device on an insulator layer and not below a second region of the same device ensures that capacitance coupling between the first region and the substrate will be less than capacitance coupling between the second region and the substrate. For example, in an SOI field effect transistor (FET), sub-insulator layer voids can be selectively placed below the source diffusion region, the drain diffusion region and/or the body contact diffusion region, but not below the channel region so that capacitance coupling between the these various diffusion regions and the substrate will be less than capacitance coupling between the channel region and the substrate. Also, disclosed herein are embodiments of an associated method of forming such an SOI structure.

What is claimed is:

1. A semiconductor-on-insulator (SOI) structure comprising:
   a semiconductor substrate having a top surface;
   an insulator layer on said top surface;
   a semiconductor layer on said insulator layer, said semiconductor layer comprising a first section and a second section positioned laterally adjacent to said first section;
   an opening extending vertically through said first section of said semiconductor layer and said insulator layer to said top surface of said semiconductor substrate, said opening containing an additional layer; and,
   an airgap in said semiconductor substrate at said top surface adjacent to said insulator layer and aligned below said opening such that said airgap is capped by said additional layer, said airgap being wider than said opening and ensuring that capacitance coupling between said first section and said substrate is less than capacitance coupling between said second section and said substrate.

2. The structure of claim 1, said additional layer comprising an additional semiconductor layer within an upper portion of said opening in said first section of said semiconductor layer and in contact with said semiconductor layer.

3. The structure of claim 2, said additional semiconductor layer and said semiconductor layer comprising different semiconductor materials.

4. The structure of claim 2, said additional semiconductor layer and said semiconductor layer comprising a same semiconductor material.

5. The structure of claim 2, said additional semiconductor layer comprising a single crystalline semiconductor material.

6. The structure of claim 1, said opening being tapered such that an upper portion of said opening within said first section of said semiconductor layer is wider than a lower portion of said opening within said insulator layer, at least said upper portion being filled with said additional layer.

7. The structure of claim 1, said first section comprising a first device and said second section comprising a second device.

8. The structure of claim 1, said first section comprising a first region of a device and said second section comprising a second region of said device.

9. A semiconductor-on-insulator (SOI) structure comprising:
   a semiconductor substrate having a top surface;
   an insulator layer on said top surface;
   a single crystalline semiconductor layer on said insulator layer, said semiconductor layer comprising a first section and a second section positioned laterally adjacent to said first section;
   an opening extending vertically through said first section of said semiconductor layer and said insulator layer to said top surface of said semiconductor substrate, said opening containing an additional single crystalline semiconductor layer in contact with said single crystalline semiconductor layer; and
   an airgap in said semiconductor substrate at said top surface adjacent to said insulator layer and aligned below said opening such that said airgap is capped by said additional single crystalline semiconductor layer, said airgap being wider than said opening and ensuring that capacitance coupling between said first section and said substrate is less than capacitance coupling between said second section and said substrate.

10. The structure of claim 9, said opening being tapered such that an upper portion of said opening within said first section of said single crystalline semiconductor layer is wider than a lower portion of said opening within said insulator layer, at least said upper portion being filled with said additional single crystalline semiconductor layer.

11. The structure of claim 9, said first section comprising a first device and said second section comprising a second device.

12. The structure of claim 9, said additional single crystalline semiconductor layer and said single crystalline semiconductor layer comprising a same semiconductor material.

13. The structure of claim 9, said first section comprising a first region of a device and said second section comprising a second region of said device.

14. The structure of claim 9, said additional single crystalline semiconductor layer and said single crystalline semiconductor layer comprising different semiconductor materials.

15. A semiconductor-on-insulator (SOI) structure comprising:
   a semiconductor substrate having a top surface;
   an insulator layer on said top surface;
   a semiconductor layer on said insulator layer, said semiconductor layer comprising a first section and a second section positioned laterally adjacent to said first section;
   an opening extending vertically through said first section of said semiconductor layer and said insulator layer to said top surface of said semiconductor substrate, said opening containing an epitaxial semiconductor layer; and
   an airgap in said semiconductor substrate at said top surface adjacent to said insulator layer and aligned below said opening such that said airgap is capped by said epitaxial semiconductor layer, said airgap being wider than said opening and ensuring that capacitance coupling between said first section and said substrate is less than capacitance coupling between said second section and said substrate.

16. The structure of claim 15, said opening being tapered such that an upper portion of said opening within said first section of said semiconductor layer is wider than a lower portion of said opening within said insulator layer, at least said upper portion being filled with said epitaxial semiconductor layer such that said epitaxial semiconductor layer is in contact with said semiconductor layer.

17. The structure of claim 15, said first section comprising a first device and said second section comprising a second device.

18. The structure of claim 15, said first section comprising a first region of a device and said second section comprising a second region of said device.

19. The structure of claim 15, said epitaxial semiconductor layer and said semiconductor layer comprising different semiconductor materials.

20. The structure of claim 15, said epitaxial semiconductor layer and said semiconductor layer comprising a same semiconductor material.

* * * * *